United States Patent [19]
Allen

[11] Patent Number: 5,589,790
[45] Date of Patent: Dec. 31, 1996

[54] INPUT STRUCTURE FOR RECEIVING HIGH VOLTAGE SIGNALS ON A LOW VOLTAGE INTEGRATED CIRCUIT DEVICE

[75] Inventor: Michael J. Allen, Rescue, Calif.

[73] Assignee: Intel Corporation, Santa Clara, Calif.

[21] Appl. No.: 496,872

[22] Filed: Jun. 30, 1995

[51] Int. Cl.⁶ ...................... H03K 19/0175; G06F 13/00
[52] U.S. Cl. .................... 327/333; 327/320; 327/321; 326/80
[58] Field of Search ...................... 327/333, 309, 327/283, 290, 268, 306, 315, 318, 319, 320, 321; 326/80, 67, 74, 78

[56] References Cited

U.S. PATENT DOCUMENTS

| | | | |
|---|---|---|---|
| 3,593,038 | 7/1971 | Hylten-Cavallius et al. | 327/514 |
| 4,119,996 | 10/1978 | Jhabvala | 357/23 |
| 4,158,786 | 6/1979 | Hirasawa | 327/543 |
| 4,227,462 | 10/1980 | Tucker | 327/14 |
| 4,918,026 | 4/1990 | Kosiak et al. | 437/33 |
| 4,922,311 | 5/1990 | Lee et al. | 357/23.1 |
| 4,968,901 | 11/1990 | Shacter | 327/74 |
| 4,996,443 | 2/1991 | Tateno | 307/264 |
| 5,016,077 | 5/1991 | Sato et al. | 357/41 |
| 5,231,315 | 7/1993 | Thelen, Jr. | 327/103 |
| 5,239,197 | 8/1993 | Yamamoto | 257/500 |
| 5,243,236 | 9/1993 | McDaniel | 307/443 |
| 5,274,828 | 12/1993 | McAdams | 395/750 |
| 5,300,832 | 4/1994 | Rogers | 307/475 |
| 5,321,324 | 6/1994 | Hardee et al. | 307/475 |
| 5,352,936 | 10/1994 | Allen | 307/304 |
| 5,399,917 | 3/1995 | Allen et al. | 327/436 |
| 5,500,824 | 3/1996 | Fink | 365/149 |

FOREIGN PATENT DOCUMENTS

| | | | |
|---|---|---|---|
| 0184222 | 6/1986 | European Pat. Off. | H01L 27/08 |
| 57-162466 | 10/1982 | Japan | H01L 29/78 |
| 2-238668 | 9/1990 | Japan | H01L 27/88 |

OTHER PUBLICATIONS

Krick et al., "Integrable Symmetrical High–Voltage MOSFET Structure", *IBM Technical Disclosure Bulletin*, vol. 15, No. 6, Nov. 1972, pp. 1884–1885.

*Primary Examiner*—Timothy P. Callahan
*Assistant Examiner*—Terry L. Englund
*Attorney, Agent, or Firm*—Blakely, Sokoloff, Taylor & Zafman

[57] ABSTRACT

An input structure transmits legacy signals to internal logic of a low voltage integrated circuit. The input structure includes a first node coupled to both a resistor voltage divider and a capacitor voltage divider, both of which have center taps coupled together, and also to the internal logic. The capacitor and resistor voltage dividers function to divide the higher voltage logic level range associated with the legacy signals to the low voltage logic level range suitable for input to the internal logic.

3 Claims, 3 Drawing Sheets

INPUT STRUCTURE FOR RECEIVING HIGH VOLTAGE SIGNALS ON A LOW VOLTAGE INTEGRATED CIRCUIT DEVICE

FIELD OF THE INVENTION

The invention relates to the field of integrated circuit devices. Specifically, the invention relates to integrated circuit device input structures for interfacing low voltage circuits to higher voltage signals.

BACKGROUND OF THE INVENTION

Power consumption is a primary consideration for designers and manufacturers of computer systems and computer system components. This focus extends from the lowest levels of integrated circuit device design up to the computer system power supply itself. Power consumption at the system, component, and device levels is more important now than ever before for a number of reasons. Lower power consumption means longer battery life for portable computers, and improved heat dissipation characteristics for higher density integrated circuit components and computer systems. Improved heat dissipation characteristics are especially important for the smaller form factors of modern computers which leave little room for bulky cooling devices such as high air flow fans or large heat sinks.

One of the primary ways to decrease power consumption of an integrated circuit device is to lower its operating voltage. Advances in semiconductor processing technology and integrated circuit design have helped to reduce the operating voltages of many CMOS integrated circuit devices from 5 volts to 3.3 volts. Current and future generations of processing technology will provide for components which operate at even lower voltages such as 2.9 volts, 2.5 volts and 1.8 volts.

The operating voltage of a particular component is significant because it often determines the voltage swing, or high and low levels of input and output signals, associated with that component. For example, a device with an operating voltage of 3.3 volts may receive input signals and generate output signals which vary from 0 volts to 3.3 volts in magnitude. While this is not always true, such as in the case where low voltage swing transmission logic, such as GTL, is used, many integrated circuit components receive input signals and generate output signals with voltage swings determined by their operating voltage or Vcc.

While components designed and manufactured to operate at lower voltages provide reduced power consumption, it is not feasible for all integrated circuit components to be redesigned and transferred to new lower voltage processes simultaneously. Thus, a lower voltage integrated circuit component must often be capable of interfacing or communicating with older, higher voltage components in a computer system, for example. The higher voltage signals from higher voltage integrated circuit components are alternately referred to herein as "legacy signals".

One approach to addressing this issue relies on NMOS pass gates integrated on the lower voltage chip near its inputs. The NMOS pass gates reduce the legacy signal voltage and clamp it in a safe range such that it is usable by the rest of the chip. There is an issue, however, when the lower voltage process used to manufacture the chip, cannot tolerate the high voltage of the legacy signals.

Integrated circuit components fabricated to operate at lower voltages have reduced gate oxide thicknesses as compared to their higher voltage counterparts. Thinner gate oxides decrease the ability of transistors to withstand high gate-to-source voltages without experiencing either gradual or catastrophic failure. Catastrophic failure results when a voltage applied to a transistor is higher than the transistor breakdown voltage. The thinner gate oxides of lower voltage components can reduce transistor breakdown voltages significantly. Thus, the use of integrated pass gates to reduce the voltage of legacy signals is not a viable approach where the transistor breakdown voltage of the pass gate is lower than or near the input voltage range.

Another approach for interfacing lower voltage integrated circuit components with legacy signals, uses external buffer devices to decrease the voltage of a signal to a usable level before it reaches the low voltage integrated circuit component input buffer. Each external buffer used, however, introduces a signal delay. With the increased operating frequencies of many computers, and tighter timing restrictions on clock signals, this approach is not viable in many high frequency operating environments. Further, external buffers take up additional space in the computer system reducing design flexibility and adding to the overall system cost.

Thus, it is desirable to have an apparatus and method for allowing integrated circuit components with low operating voltages to receive higher voltage signals without adding unacceptable signal delays or compromising transistor reliability.

SUMMARY OF THE INVENTION

An integrated circuit structure for receiving high voltage signals on a low voltage integrated circuit device is described. The invention includes a first input node for receiving a first signal at a first voltage. The input node is coupled to a resistor voltage divider having a first center tap. A capacitor voltage divider having a second center tap is coupled in parallel to the resistor voltage divider. A buffer of the low voltage integrated circuit device has an input coupled to the first and second center taps such that the buffer receives a second, lower voltage signal in response to the first signal received at the input.

In one embodiment, the input structure of the invention also includes a disable input for disabling the resistor voltage divider such that the second signal received by the input buffer is the same voltage as the first signal received on the input node.

BRIEF DESCRIPTION OF THE DRAWINGS

The invention will be understood more fully from the detailed description given below and from the accompanying drawings of embodiments of the invention, which, however, should not be taken to limit the invention to the specific embodiments, but are for explanation and understanding only.

DETAILED DESCRIPTION OF THE INVENTION

An integrated circuit device input structure for receiving high voltage signals on a low voltage integrated circuit device is described. In the following description, numerous specific details are set forth, such as specific voltage levels, device types, device configurations, etc., in order to provide a thorough understanding of the invention. However, it will be appreciated by one of ordinary skill in the art, that the invention may be practiced without these specific details. In other instances, well-known structures, circuit blocks, interfaces and architectural functions have not been described in detail in order to avoid obscuring the invention.

Overview of the Computer System of the Invention

Figure 1:
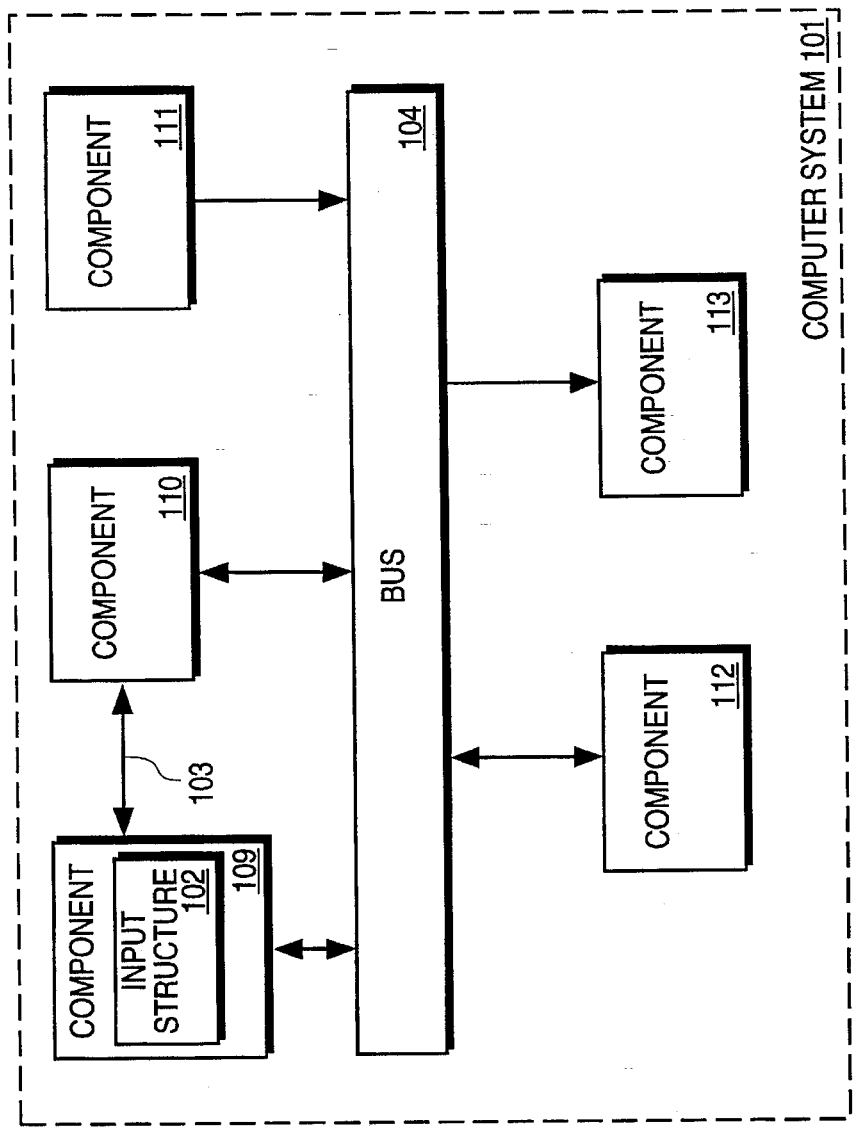
FIG. 1 illustrates a block diagram of a computer system in accordance with one embodiment of the invention, including components having various operating voltages.

FIG. 1 illustrates a computer system in accordance with one embodiment of the invention. The computer system 101 includes a bus 104 for communicating information between components 109–113 of the computer system. The components 109–113 represent integrated circuit devices and other computer system components which may be present in computer system 101. The components 109–113 may include devices such as a central processing unit (CPU), a memory subsystem including static, dynamic and mass storage memory devices, and peripheral components such as a display, keyboard, printer and/or cursor control. A computer system in accordance with the invention may include a larger or smaller number of computer system components than those illustrated in FIG. 1, and may further include additional buses, transmission lines or other connections providing for more localized communication between particular computer system components.

Still referring to FIG. 1, in one embodiment, the component 109 is manufactured on a lower voltage process than the components 110–113. In other words, the component 109 operates at a lower supply voltage than the components 110–113. For example, in one embodiment, the component 109 may operate from a supply voltage (Vcc) of 1.8 volts and the components 110–113 may each operate from supply voltages of 3.3 volts. In this embodiment, the supply voltage of each component determines the voltage swing of desired input and output signals of the particular component. Thus, the component 110 with an operating voltage of 3.3 volts will ideally transmit output signals which range from 0 volts to 3.3 volts in magnitude.

In operation, the component 109 receives signals from the components 110–113 via the bus 104, another signal line 103 and other interconnections between the component 109 and the components 110–113 (not shown). Input buffers of the component 109 receive external signals before they are routed to other circuits within the component 109. The signals from the components 110–113 are at a higher voltage than is desirable for direct application to input buffers on the component 109. Thus, the component 109 also includes an input structure 102 for receiving higher voltage signals from other components in the computer system 101 and reducing the signal voltage to a level that is safe for processing by input buffers and other circuitry of the component 109. The input structure 102 is described in more detail below in reference to FIGS. 2 and 3.

In alternate embodiments, several of the components 109–113 in the computer system 101 include input structures such as the input structure 102. It will be appreciated by one of ordinary skill in the art that the computer system of the invention may include more or fewer components than those illustrated in FIG. 1. Also, in alternative embodiments, components other than the component 109 may be manufactured on low voltage processes and include the input structure 102.

Figure 2:
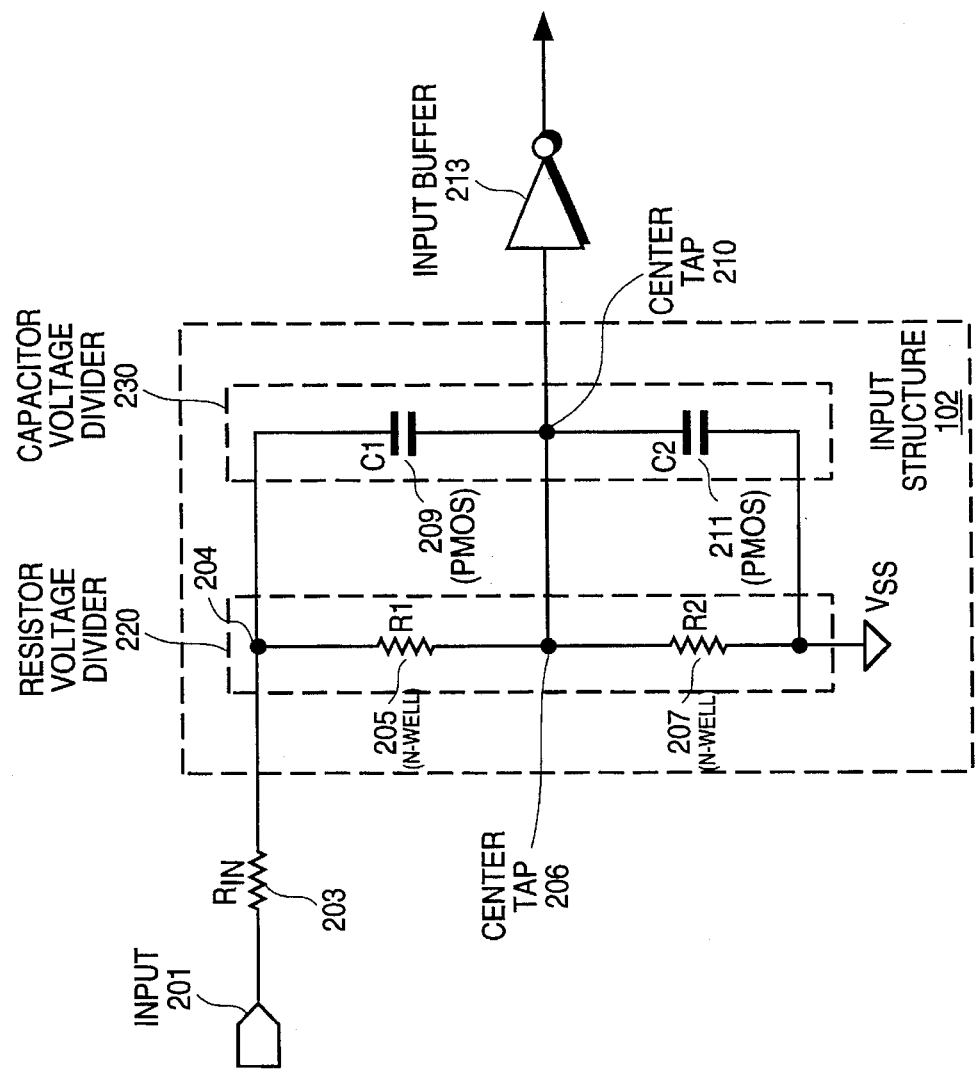
FIG. 2 illustrates an integrated circuit device input structure of one embodiment of the invention.

One embodiment of the input structure 102 of the invention is illustrated in FIG. 2. In one embodiment, the input structure 102 is integrated into an integrated circuit device such as the component 109 in FIG. 1. The input structure 102 receives signals from external components, such as the components 110–113 in FIG. 1, on the input pad 201. The input 201 is coupled to a resistor voltage divider 220 and a capacitor voltage divider 230 through an input resistance $R_{IN}$ 203. In one embodiment, the resistor voltage divider 220 includes resistors R1 205 and R2 207, and a center tap 206. Similarly, the capacitor voltage divider 230 includes capacitors C1 209 and C2 211, and a center tap 210. The resistor voltage divider 220 is coupled in series with the input resistance $R_{IN}$ 203, and coupled in parallel with the capacitor voltage divider 230, in one embodiment of the invention.

The input buffer 213 is configured on the same integrated circuit device as the input structure 102 and operates to forward signals from external components to other circuits within the integrated circuit device. The input buffer 213 is coupled to the center taps of both the resistor voltage divider 220 and the capacitor voltage divider 230. It is appreciated that the center tap 206 is short circuited to the center tap 210 such that the voltage at both center taps is the same. In some embodiments, the center tap 206 and the center tap 210 are physically the same node.

In operation, the input 201 receives a first input voltage from an external source and transmits the voltage signal through the input resistance $R_{IN}$ to the input structure 102. The resistor voltage divider 220 operates to reduce the voltage of the input signal to a voltage level that is safe for the input buffer 213 and other devices within the integrated circuit component. The input buffer 213 receives the voltage signal at the center taps 206 and 210. The voltage of the signal received by the input buffer 213 at the center taps 206 and 210, is determined by the ratio of the resistances of each of the resistors R1 205 and R2 207, and in some cases, $R_{IN}$, to their cumulative resistance. In one embodiment, the resistors R1 205 and R2 207 have very high resistances in comparison with the input resistance $R_{IN}$ 203 such that the resistance of $R_{IN}$ 203 is negligible. In other words, the voltage drops across the resistors R1 205 and R2 207 are very large in comparison with the voltage drop across $R_{IN}$ 203.

In one embodiment, the resistors R1 205 and R2 207 have equal resistances such that the voltage of a signal at the center taps 206 and 210 is about half of the voltage of the incoming signal on the input 201. In another embodiment, the resistor R1 205 is larger than the resistor R2 207 such that the voltage at the center taps 206 and 210 is less than half of the voltage of the incoming signal on the input 201. For example, in one embodiment, a voltage signal received on the input 201 has a voltage which ranges from 0 to 3.3 volts. In this embodiment, it is desirable for the input buffer 213 to receive a voltage no higher than 1.8 volts. In this case, the resistors R1 205 and R2 207 are selected such that the ratio of the resistance of R2 207 to the total of the resistances of R1 205 and R2 207 together equals the ratio between the desired voltage on center taps 206 and 210 (1.8 volts) to the input voltage (3.3 volts). It will be appreciated by one of ordinary skill in the art that the resistors R1 205 and R2 207 can be selected in this manner, to provide the desired voltage at the center taps 206 and 210 based on the ratios of the resistance values of the resistors R1 205, R2 207, and in some embodiments, $R_{IN}$ 203, to the total of their resistances. Thus, the resistors R1 205 and R2 207 can be selected such that the resistor divider 220 reduces the voltage of incoming signals to a low level.

In one embodiment, the resistors R1 205 and R2 207 are n-well resistor devices constructed on a low voltage CMOS process. N-well devices are capable of withstanding high voltages in comparison to their source/drain diffusions. The value of the resistors R1 205 and R2 207 is determined based on several considerations including space and layout constraints, as well as acceptable power dissipation. It is desirable for the resistors R1 205 and R2 207 to have the highest resistance possible for the space available in the integrated circuit device. The higher the resistances of R1 205 and R2 207, the lower the current that flows through them, and thus, the lower the power dissipation of the input structure 102. The resistances of R1 205 and R2 207 in relation to each other are determined based on the desired voltage for the input buffer 213 as well as the voltage swing of the input signal received on the input 201 as described above. Although n-well devices are described in relation to a particular embodiment, it is appreciated that other types of resistors are within the scope of the invention.

The capacitor voltage divider 230 is coupled in parallel with the resistor voltage divider 220. In one embodiment, the resistors R1 205 and R2 207 have high resistances such that the current flowing through the resistor voltage divider 220 is negligible. The capacitor voltage divider 230 provides for fast signal switching such that the characteristics of the signal received on the input 201, other than the voltage level, are accurately transmitted to the input buffer 213.

In one embodiment, the capacitors C1 209 and C2 211 are PMOS capacitor structures. PMOS capacitors are desirable in some embodiments because they take up very little space on the integrated circuit device in comparison with some other capacitor structures. In one embodiment, the capacitors C1 209 and C2 211 have capacitances of 0.1 pF. In another embodiment, the capacitors C1 209 and C2 211 each have the highest capacitances possible in light of space considerations, with a minimum capacitance equal to at least twice the capacitance of the input buffer 213. Although one embodiment of the invention uses PMOS capacitor structures, other capacitor structures such as ordinary metal-to-metal plate structures, may also be used in accordance with the invention, especially where space considerations are not an issue.

In the manner described above, the input structure 102 operates to reduce the voltage of an incoming signal on the input 201 to a voltage range acceptable for the input buffer 213.

Figure 3:
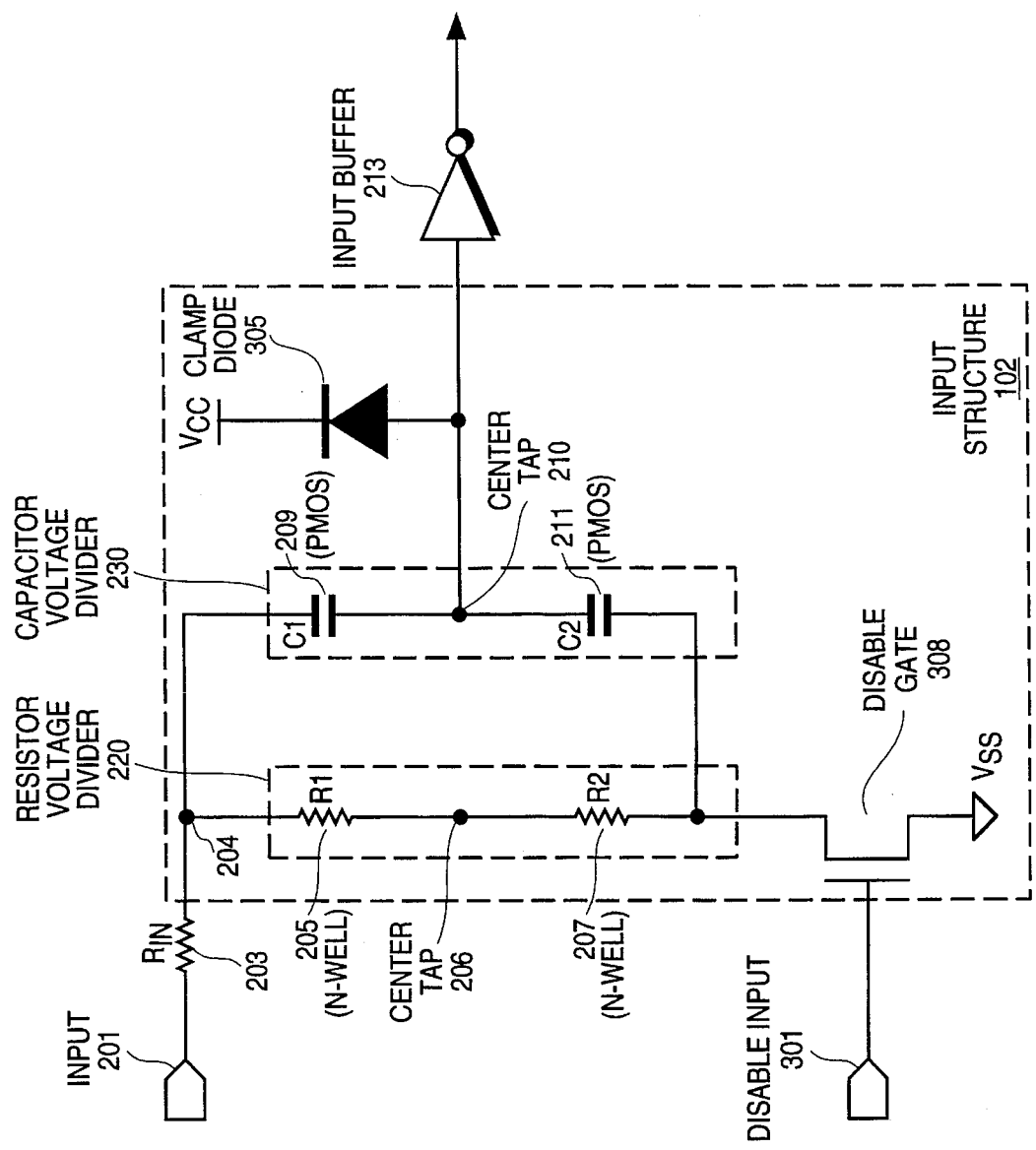
FIG. 3 illustrates an input structure of an alternate embodiment of the invention.

FIG. 3 illustrates an alternate embodiment of the invention. In the embodiment of the input structure illustrated in FIG. 3, like reference numbers indicate components which are similar or identical to the same components illustrated in FIG. 2.

With reference to FIG. 3, the input structure 102 of the invention includes features to provide additional flexibility and functionality. As in embodiments described above, the input structure 102 is integrated into an integrated circuit component such as the component 109 (FIG. 1). The input structure 102 in the embodiment illustrated in FIG. 3, includes a clamp diode 305. The clamp diode 305 is tied to the supply voltage of the low voltage component and is coupled between the input buffer 213 and the center tap 210 to keep the voltage of signals transmitted to the input buffer 213 within a safe range.

The clamp diode 305 operates, for example, to prevent voltage spikes caused by such events as electro-static discharge (ESD), from destroying the input buffer 213. The clamp diode 305 has a specific diode voltage drop or threshold voltage. With the clamp diode 305 tied to Vcc, signals on the center tap 210 with voltages higher than Vcc by the diode threshold voltage, forward bias the diode 305 such that the signal voltage is clamped to a voltage equal to Vcc plus the characteristic threshold voltage of the particular diode used. It is appreciated that other devices for clamping signal voltages within a safe range for receipt by the input buffer 213, are also within the scope of the invention.

The embodiment of the input structure 102 illustrated in FIG. 3 also includes a disable gate 308 coupled to a disable input 301. When a voltage above the threshold voltage of the disable gate 308 is applied to the disable input 301, the disable gate 308 is turned on. With the disable gate 308 turned on, the resistor voltage divider 220 and the capacitor voltage divider 230 operate as described above with reference to FIG. 2. Thus, in the embodiment illustrated in FIG. 3, the disable gate 308 is turned on to enable the input structure 102 to operate to reduce the voltage of an incoming, higher voltage signal to an acceptable voltage level for the input buffer 213.

Turning the disable gate 308 off operates to disable the resistor voltage divider circuit 220. The disable gate 308 acts as the equivalent of an open circuit when it is turned off or disabled. Thus, the DC current path through the resistor R2 207 is disable and a voltage signal received on the input 201 is transmitted directly to the input buffer 213 through the resistor $R_{IN}$ 203, the resistor R1 205, and the capacitor C1 209 without significantly reducing its voltage level. Other devices which operate as a gate or a switch to provide the same function as the disable gate 308 are also within the scope of the invention.

The disable gate 308 in the input structure 102, provides for increased flexibility and testability of integrated circuit components. For example, an integrated circuit device in accordance with the invention can use the disable gate 308 to disable the resistor voltage divider 220 in a computer system transmitting only low voltage signals. Alternately, in a system having both high and low voltage signals, low voltage signals can be sensed such that the disable gate 308 is turned off and signals are transmitted directly from the input 201 to the input buffer 213 through the input resistor $R_{IN}$ 203, the resistor R1 205 and the capacitor C1 209 when the voltage swing of an input signal is within an acceptable range. In this manner, the voltage of the signal received by the input buffer 213 is effectively the same as the voltage received by the input 201.

The disable gate 308 also provides another advantage. It is often useful to be able to detect device leakage currents when testing and characterizing integrated circuit devices and the semiconductor process used to manufacture them. In one embodiment, when the disable gate 308 is disabled, the leakage current of the transistors forming the input buffer 213, can be measured and thus, certain characteristics of the device and the process, such as long term reliability expectations, can be determined.

It is appreciated by those of ordinary skill in the art, that although the embodiments described above refer to an input structure, the circuit of the present invention may also be configured at other locations within an integrated circuit device. Also, while the lower voltage signal is supplied to an input buffer in one embodiment of the invention, the lower voltage signal may also be received by another type of buffer or a different lower voltage device.

In addition to the foregoing, the invention provides several advantages over many prior art approaches to interfacing legacy signals with lower voltage integrated circuit components. The invention reduces the voltage of incoming signals to a level that is safe for the lower voltage integrated circuit component without risking gradual or catastrophic failure of devices on the integrated circuit component. Further, the invention reduces the voltage level of incoming signals without buffering or otherwise adding potentially problematic signal delays. Also, incoming signals can be reduced to a very low voltage level by scaling resistance and capacitance values in the invention.

The flexibility provided by the invention can help to simplify system level design, and remove some component development activity from the critical path for system level development. System designers do not have to delay system level designs waiting for all, or even most of the components in the system to be manufactured on technologies with the same supply voltage or signal voltage levels. In this manner, new systems and technologies can be developed and ramped more quickly. For example, in many cases, microprocessors are among the first components to be manufactured on lower voltage processes. Using the invention, it is easier to design new processors to fit into existing system designs, thus speeding the microprocessors time to market. Other advantages of the invention will be appreciated by one of ordinary skill in the art.

Thus the invention provides an effective means and method for reducing high voltage input signals to a safe range for lower voltage integrated circuit devices. The invention accomplishes this without degrading the reliability of devices on the lower voltage component and without introducing unacceptable signal delays.

Whereas many alterations and modifications of the present invention will be appreciated by a person of ordinary skill in the art after having read the foregoing description, it is understood that the particular embodiments shown and described by way of illustration are in no way intended to be considered limiting. Therefore, references to details of the individual embodiments are not intended to limit the scope of the claims which in themselves recite only those features regarded as essential to the invention.

I claim:

1. An input structure fabricated on a digital integrated circuit (IC) having internal logic operating with a low voltage logic level range, the input structure for adapting the diqital IC to receive a legacy signal having a high voltage logic level range, the input structure comprising:

a first node that receives the legacy signal;

a resistor voltage divider coupled to the first node that divides the legacy signal to the low voltage logic level range at a first center tap;

a capacitor voltage divider coupled to the first node and having a second center tap coupled to the first center tap;

a diode that clamps the center taps to approximately a supply voltage, the diode being coupled between the center taps and the supply voltage;

a transistor coupled in series with the resistor voltage divider, the transistor having a gate that controls a current flow therethrough; and wherein the first and second center taps are coupled to the internal logic of the digital IC such that the legacy signal, at the low voltage logic level range, is transmitted to the internal logic effectively without delay.

2. The input structure as set forth in claim 1 wherein the resistor voltage divider comprises a pair of n-well resistors coupled in series.

3. The input structure as set forth in claim 1 wherein the capacitor voltage divider comprises a pair of PMOS capacitors coupled in series.

* * * * *

UNITED STATES PATENT AND TRADEMARK OFFICE
CERTIFICATE OF CORRECTION

PATENT NO. : 5,589,790
DATED : December 31, 1996
INVENTOR(S) : Michael J. Allen It is certified that error appears in the above-identified patent and that said Letters Patent is hereby corrected as shown below:

In column 6 at line 24 delete "disable" and insert --disabled--

In column 7 at line 20 delete "microprocessors" and insert --microprocessors'--

Signed and Sealed this

First Day of April, 1997

*Attest:*

BRUCE LEHMAN

*Attesting Officer*     *Commissioner of Patents and Trademarks*